US008362426B2

(12) United States Patent
Kobaru et al.

(10) Patent No.: US 8,362,426 B2
(45) Date of Patent: Jan. 29, 2013

(54) SCANNING ELECTRON MICROSCOPE AND IMAGE SIGNAL PROCESSING METHOD (75) Inventors: Atsushi Kobaru, Hitachinaka (JP);
Katsuhiro Sasada, Hitachinaka (JP);
Hiroki Kawada, Tsuchiura (JP)

(73) Assignee: Hitachi High-Technologies Corporation, Tokyo (JP)

( * ) Notice: Subject to any disclaimer, the term of this patent is extended or adjusted under 35 U.S.C. 154(b) by 909 days.

(21) Appl. No.: 11/520,802

(22) Filed: Sep. 14, 2006

(65) Prior Publication Data
US 2007/0064100 A1    Mar. 22, 2007

(30) Foreign Application Priority Data

Sep. 14, 2005  (JP) ................................. 2005-267089

(51) Int. Cl.
*G01N 23/00* (2006.01)
(52) U.S. Cl. ......... 250/310; 250/306; 250/307; 250/311
(58) Field of Classification Search ........ 250/306–443.1
See application file for complete search history.

(56) References Cited

U.S. PATENT DOCUMENTS

| 3,987,242 | A  | * | 10/1976 | Gold .............................. 348/673 |
| 5,887,080 | A  | * | 3/1999  | Tsubusaki et al. ............ 382/172 |
| 6,111,981 | A  | * | 8/2000  | Tsubusaki et al. ............ 382/172 |
| 6,236,222 | B1 | * | 5/2001  | Sur et al. .................. 324/754.22 |
| 6,545,275 | B1 | * | 4/2003  | Pearl et al. ........................ 850/7 |
| 6,608,305 | B1 | * | 8/2003  | Kin et al. ....................... 250/306 |
| 6,621,571 | B1 | * | 9/2003  | Maeda et al. ............... 356/237.5 |
| 6,941,006 | B1 | * | 9/2005  | Penberth et al. .............. 382/141 |
| 6,995,370 | B2 | * | 2/2006  | Fujita et al. .................... 250/310 |
| 7,211,797 | B2 | * | 5/2007  | Nishiyama et al. ........... 250/311 |
| 7,236,651 | B2 | * | 6/2007  | Ishitani et al. ................ 382/299 |
| 7,362,448 | B1 | * | 4/2008  | Liu et al. ....................... 356/504 |

(Continued)

FOREIGN PATENT DOCUMENTS

| JP | 03-019090 | 1/1991 |
| JP | 04-264341 | 9/1992 |

(Continued)

OTHER PUBLICATIONS

Japanese Office Action issued in Japanese Patent Application No. 2005-267089, mailed Mar. 30, 2010.
Japanese Office Action issued in Japanese Patent Application No. 2005-267089, dated Sep. 1, 2009.

*Primary Examiner* — David A Vanore
*Assistant Examiner* — Andrew Smyth
(74) *Attorney, Agent, or Firm* — McDermott Will & Emery LLP (57) ABSTRACT The SEM has a dynamic range reference value setting unit for setting dynamic range reference values, a dynamic range adjustment unit for receiving an observation image signal delivered out of a secondary electron detector, adjusting the dynamic range of the observation image signal on the basis of the dynamic range reference values and outputting the thus adjusted observation image signal as an observation image signal after adjustment, a display image generation unit for determining luminous intensity levels of individual pixels of an image to be displayed based on the observation image signal after adjustment to generate a display image, a histogram generation unit for generating a histogram of luminous intensity levels of the display image and extracting, as a luminous intensity peak value, at which the frequency of luminous intensity is maximized, and a display unit for displaying the generated histogram and the extracted luminous intensity peak value.

12 Claims, 5 Drawing Sheets

U.S. PATENT DOCUMENTS

| | | | |
|---|---|---|---|
| 2001/0036314 A1* | 11/2001 | Yamaguchi et al. | 382/172 |
| 2002/0145741 A1* | 10/2002 | Kosuge et al. | 356/637 |
| 2003/0202692 A1* | 10/2003 | Obrador | 382/170 |
| 2005/0145791 A1* | 7/2005 | Fujita et al. | 250/311 |
| 2005/0184235 A1* | 8/2005 | Abe | 250/311 |
| 2005/0199811 A1* | 9/2005 | Ishitani et al. | 250/311 |
| 2005/0247860 A1* | 11/2005 | Shishido et al. | 250/210 |

FOREIGN PATENT DOCUMENTS

| | | |
|---|---|---|
| JP | 04-328234 | 11/1992 |
| JP | 2001-202911 | 7/2001 |
| JP | 2005-026192 | 1/2005 |
| JP | 2005-174555 A | 6/2005 |

* cited by examiner

SCANNING ELECTRON MICROSCOPE AND IMAGE SIGNAL PROCESSING METHOD

BACKGROUND OF THE INVENTION

The present invention relates to a scanning electron microscope in which the dynamic range of luminous intensity of a display image is adjustable and an image signal processing method having the capability as above.

In recent years, the scanning electron microscope (hereinafter simply referred to as SEM) has been used widely and frequently in many industrial fields including manufacture of semiconductors. When applied to industrial use, the SEM is often used mainly in the inspection process. In the SEM used in the application as such, reduction of the difference in measurement characteristics among a plurality of SEM apparatus is particularly required.

When the same specimen is observed with a plurality of SEM apparatus, the luminous characteristics of displayed images, especially, their dynamic ranges need to be identical. But even if the detection sensitivity, for example, of a secondary electron detector in each of the plural SEM's is set identically, the detection sensitivity of the secondary electron detector or the amplification factor of an amplifier for detection signals slightly differs product by product and therefore, making the luminous dynamic ranges of display images uniform is difficult to achieve practically.

Luminous characteristics of display screen are often represented by a histogram indicating frequencies of or corresponding to luminous intensity levels of pixels of a display image ("luminous intensity" herein means "brightness of pixel" but it is indicated in a unit different from that for "brightness" ordinarily meant). For example, in JP-A-2005-174555 (paragraphs 0021 to 0043 and FIGS. 3 to 7), an example of an SEM is described in which the dynamic range of luminous intensity is adjusted by the amplification factor of a secondary electron detection signal amplifier circuit and besides, a histogram of luminous intensity of a display image is utilized for improving contrast or visibility.

SUMMARY OF THE INVENTION

The prior art as above, however, does not provide a means for measuring the dynamic range of luminous intensity of a display image in the SEM and accordingly, does not provide a means for adjusting the dynamic range of luminous intensity, either. Under the circumstances, an object of the present invention is to provide an SEM which can measure the dynamic range of luminous intensity of a display image and also can adjust the dynamic range and an image signal processing method having the capability as above.

To solve the problem encountered in the prior art, a scanning electron microscope (SEM) according to the present invention comprises dynamic range reference value setting means for setting dynamic range reference values, dynamic range adjustment means for inputting an observation image signal outputted from a secondary electron detector, adjusting the dynamic range of the observation image signal on the basis of the dynamic range reference values set as above and outputting the thus adjusted observation image signal as an observation image signal after adjustment, display image generation means for determining luminous intensity levels of individual pixels of an image to be displayed on the basis of the observation image signal after adjustment the dynamic range adjustment means outputs to generate a display image, histogram generation means for generating a histogram of luminous intensity for the display image and extracting, from the thus generated histogram, a value at which the frequency of luminous intensity is maximized as a luminous intensity peak value, and display means for displaying the generated histogram and the extracted luminous intensity peak value.

In the SEM according to the present invention, with a dynamic range reference values set by the dynamic range reference value setting means, the dynamic range of an observation image signal delivered out of the secondary electron detector can be adjusted in accordance with the dynamic reference values and an observation image signal whose dynamic range has been adjusted can be outputted as an observation image signal after adjustment. Then, on the basis of the observation image signal after adjustment, a display image is generated and displayed. On the other hand, a histogram of luminous intensity levels of individual pixels of the display image is generated and the histogram and luminous intensity peak values are displayed.

In the SEM of the present invention, when a two-color specimen in white and black, for example, is used and a histogram of a display image of the specimen is generated, luminous intensity near the maximum value and luminous intensity near the minimum value can be obtained from the histogram, thus providing two luminous intensity peak values. These two luminous intensity peak values are ones corresponding to or defining the dynamic range of luminous intensity of the display image and therefore, by using these tow luminous intensity peak values, the dynamic range of luminous intensity of the display image can be measured. Further, by setting dynamic range reference values suitably by means of the dynamic range reference value setting means, the aforementioned two luminous intensity peak values, that is, the dynamic range can be adjusted.

In other words, according to the present invention, by measuring luminous intensity peak values in respective ones of a plurality of SEM's, the difference in dynamic range among the individual SEM's can be known and by adjusting the dynamic range reference values such that luminous intensity peak values can be identical for the individual SEM's, the dynamic ranges of luminous intensity of display images can be made to be uniform among the plurality of SEM's.

According to the invention, an SEM can be provided which can measure the dynamic range of luminous intensity of a display image and can adjust the dynamic range. As a result, the dynamic range of luminous intensity of display images can be made to be uniform among a plurality of SEM's.

Other objects, features and advantages of the invention will become apparent from the following description of the embodiments of the invention taken in conjunction with the accompanying drawings.

DETAILED DESCRIPTION OF THE EMBODIMENTS

Figure 1:
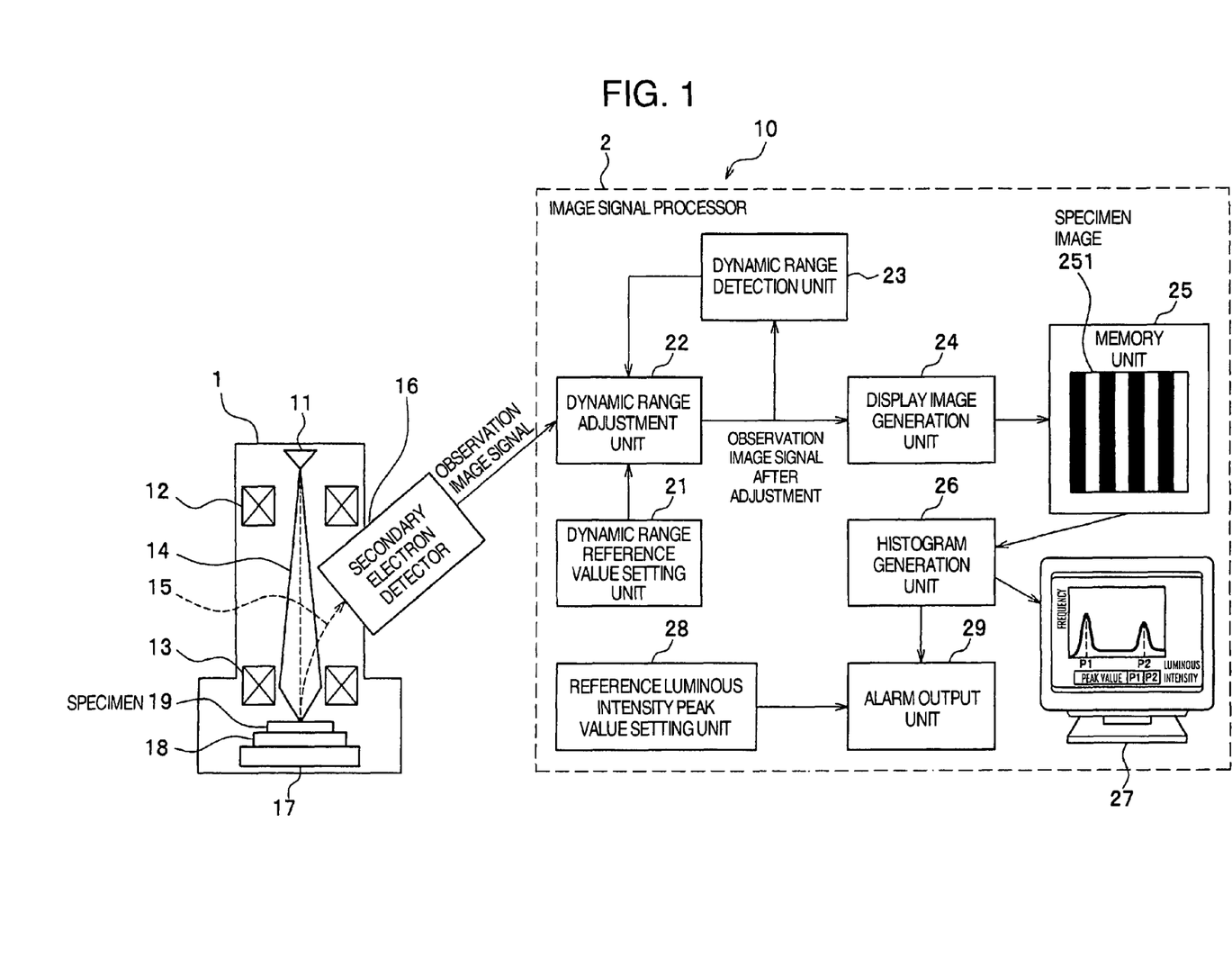
FIG. 1 is a block diagram showing schematic construction of a scanning electron microscope (SEM) according to an embodiment of the present invention.

An embodiment of the present invention will now be described in greater detail by making reference to FIGS. 1 to 5 as necessary. Referring first to FIG. 1, a scanning electron microscope (SEM) according to the present embodiment is schematically constructed as illustrated therein. As shown in FIG. 1, the SEM generally designated at reference numeral 10 comprises an optics column 1 housing an electron gun 11, a condenser lens 12, an objective lens 13, a secondary electron detector 16 and an XY stage 17 and an image signal processor 2 for processing an observation image signal of specimen 19 delivered out of the secondary electron detector 16 is connected to the optics column 1.

In the optics column 1, a primary electron beam 14 emitted from the electron gun 11 is irradiated on the specimen 19 and secondary electrons 15 are discharged from a portion of specimen 19 irradiated with the primary electron beam 14. The secondary electron detector 16 detects and amplifies the secondary electrons 15 to output an observation image signal. In this phase, the primary electron beam 14 is controllably deflected so as to scan an observation area on the specimen 19. The specimen 19 is fixedly mounted to a specimen holder 18 carried on the XY stage 17 and by controllably moving the XY stage 17 in the horizontal direction, the center position of the observation area on the specimen 19 can be set.

The image signal processor 2 includes a dynamic range reference value setting unit 21, a dynamic range adjustment unit 22, a dynamic range detection unit 23, a display image generation unit 24, a memory unit 25, a histogram generation unit 26, a display unit 27, a reference luminous intensity peak value setting unit 28 and an alarm output unit 29. In the present embodiment, the image signal processor 2 is constructed of a computer having a CPU (Central Processing Unit) and a memory and signal processing in the processor is executed through digital processing.

Prior to a subsequent description given of the function and operation of individual blocks or components of the image signal processor, the dynamic range of luminous intensity of a display image will first be described with reference to FIG. 2. Illustrated in FIG. 2 is an example of a video signal inputted to the display unit such as a CRT (Cathode Ray Tube) or LCD (Liquid Crystal Display).

Figure 2:
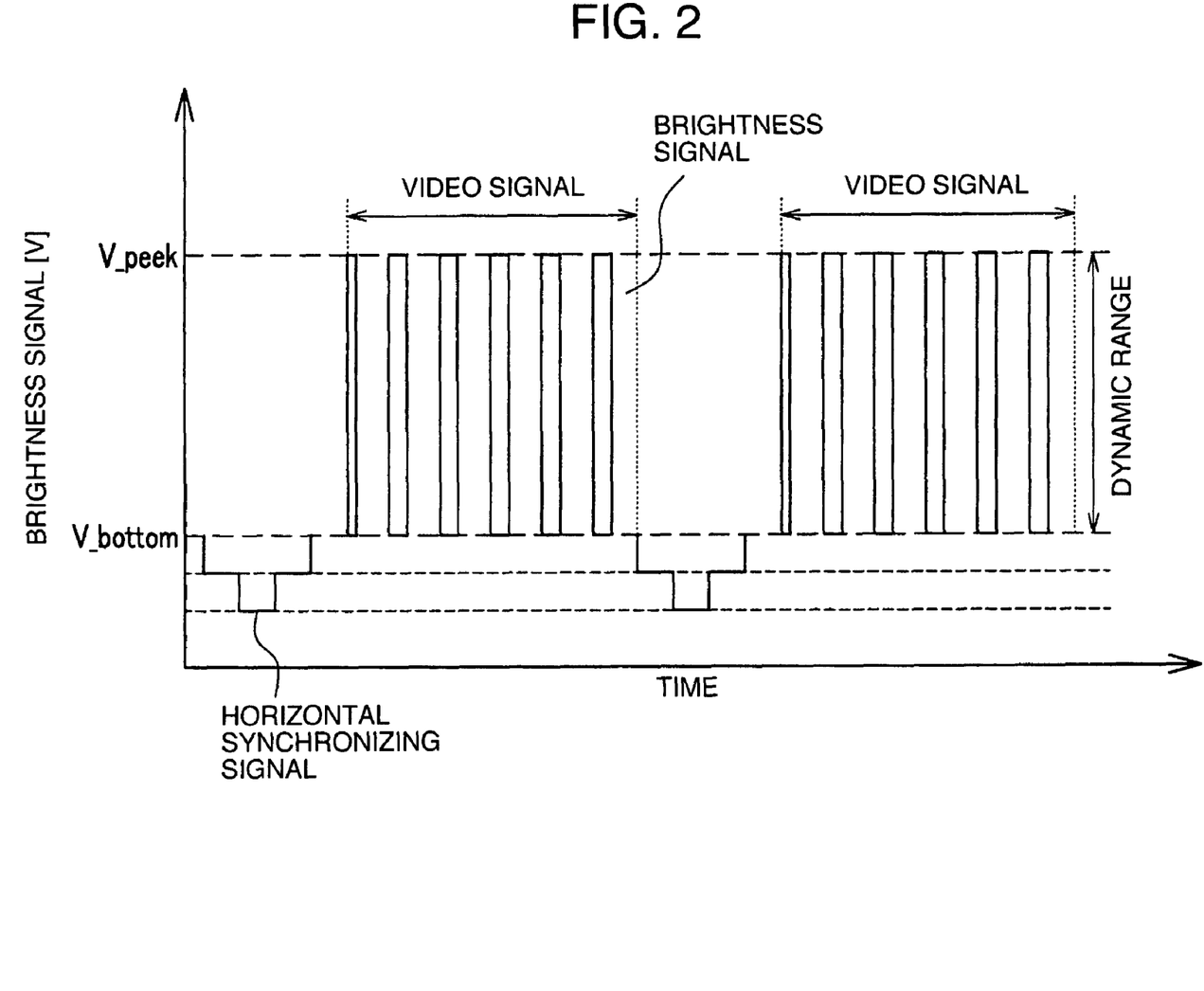
FIG. 2 is a time chart showing an example of a video signal inputted to a display unit such as a CRT or LCD.

In the time chart of FIG. 2, ordinate represents brightness signal and abscissa represents time. A television signal includes a video signal and a horizontal synchronizing signal and the video signal is generated on the basis of luminous intensity levels of individual pixels of an image to be displayed. Accordingly, the dynamic range of luminous intensity of a display image can be defined as the difference between maximum brightness V_peak and minimum brightness V_bottom. It will be appreciated that the video signal shown in FIG. 2 is one obtained when, for example, a specimen of white and black stripe pattern as shown at specimen image 251 in FIG. 1 is subjected to scanning which proceeds across the stripes.

In FIG. 1, the dynamic range reference value setting unit 21 sets a dynamic range reference value which is referenced to by the dynamic range adjustment unit 22 when it adjusts the dynamic range of an observation image signal delivered out of the secondary electron detector 16. In this case, for the dynamic range reference value, two values of VR_peak and VR_bottom are set which correspond to the maximum brightness V_peak and the minimum brightness V_bottom of video signal of the display image, respectively. This setting can be conducted by inputting numerical values desired to be set from a keyboard, for example.

The dynamic range adjustment unit 22 receives an observation image signal delivered out of the secondary electron detector 16, adjusts the dynamic range of the observation image signal on the basis the dynamic range reference values set by the dynamic range reference value setting unit 21 and a dynamic range of a signal per se detected and delivered by the dynamic range detection unit 23 and outputs the thus adjusted observation image signal as an observation image signal after adjustment. Operation of adjustment by the dynamic range adjustment unit 22 will be described later with reference to FIGS. 3 and 4.

The display image generation unit 24 receives an input of the observation signal after adjustment the dynamic range adjustment unit 22 outputs, determines luminous intensity levels of individual pixels of an image to be displayed on the basis of the inputted observation signal after adjustment to generate a display image in the form of a bit map and stores data of the thus generated display image in the memory unit 25. Here, the memory unit 25 is an image memory constructed of a RAM (Random Access Memory), for instance. Assumptively, in this example, the specimen 19 to be observed has a white and black stripe pattern such as specimen image 251.

In respect of the image generated by the display image generation unit 24, that is, in respect of luminous intensity levels of the individual pixels of the display image stored in the memory unit 25, the histogram generation unit 26 generates a histogram indicating frequencies of or corresponding to the luminous intensity levels. Then, a value of luminous intensity at which the frequency of luminous intensity is maximized is extracted as a luminous intensity peak value from the generated histogram. The thus generated histogram and extracted luminous intensity peak value are displayed on the display unit 27 such as a CRT or LCD.

In the case of the specimen 19 to be observed being a specimen of white and black pattern such as specimen image 251, the corresponding histogram has maximum values at opposite ends as exemplarily displayed on the display unit 27. In this case, a luminous intensity peak value P1 near the minimum luminous intensity corresponds to the minimum brightness V_bottom of the video signal shown in FIG. 2 and a luminous intensity peak value P2 near the maximum luminous intensity is a value determined in correspondence with the maximum brightness V_peak. Accordingly, the luminous intensity peak values P1 and P2 can be said to be numerical values objectively indicating a dynamic range of the display image. Namely, the luminous intensity peak values P1 and P2 can provide a means for objectively measuring the dynamic range of the display image.

In FIG. 1, the image signal processor 2 is illustrated as including the reference luminous intensity peak value setting unit 28 and alarm output unit 29, these blocks being operative to function as will be described later.

Figure 3:
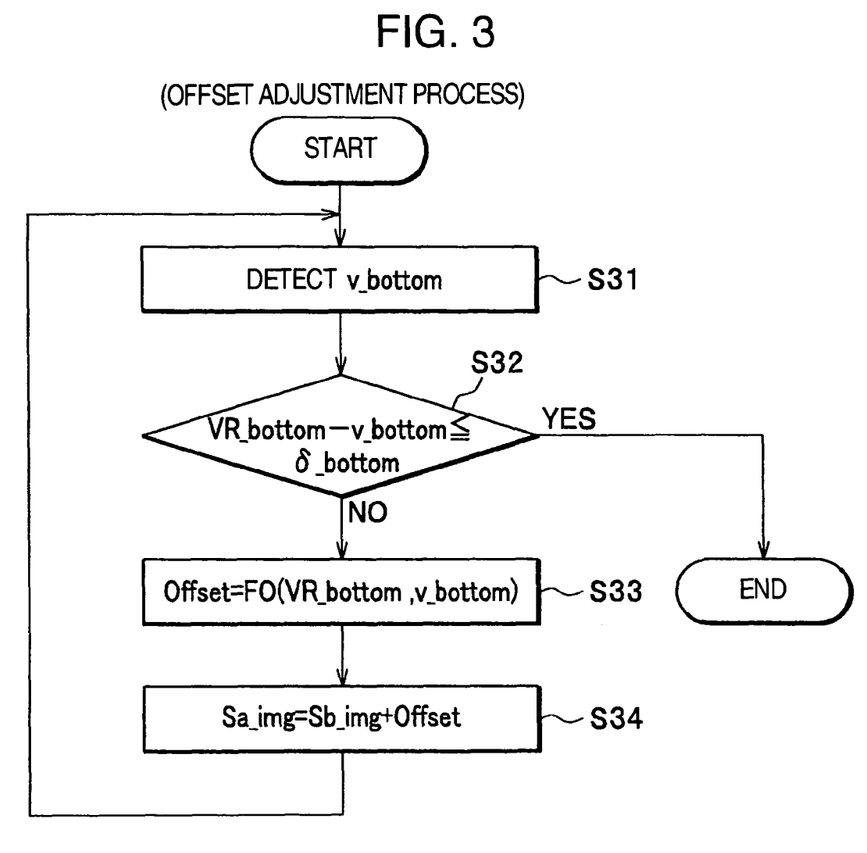
FIG. 3 is a flowchart of an offset adjustment process by a dynamic range adjustment unit in the SEM according to the embodiment of the invention.
Figure 4:
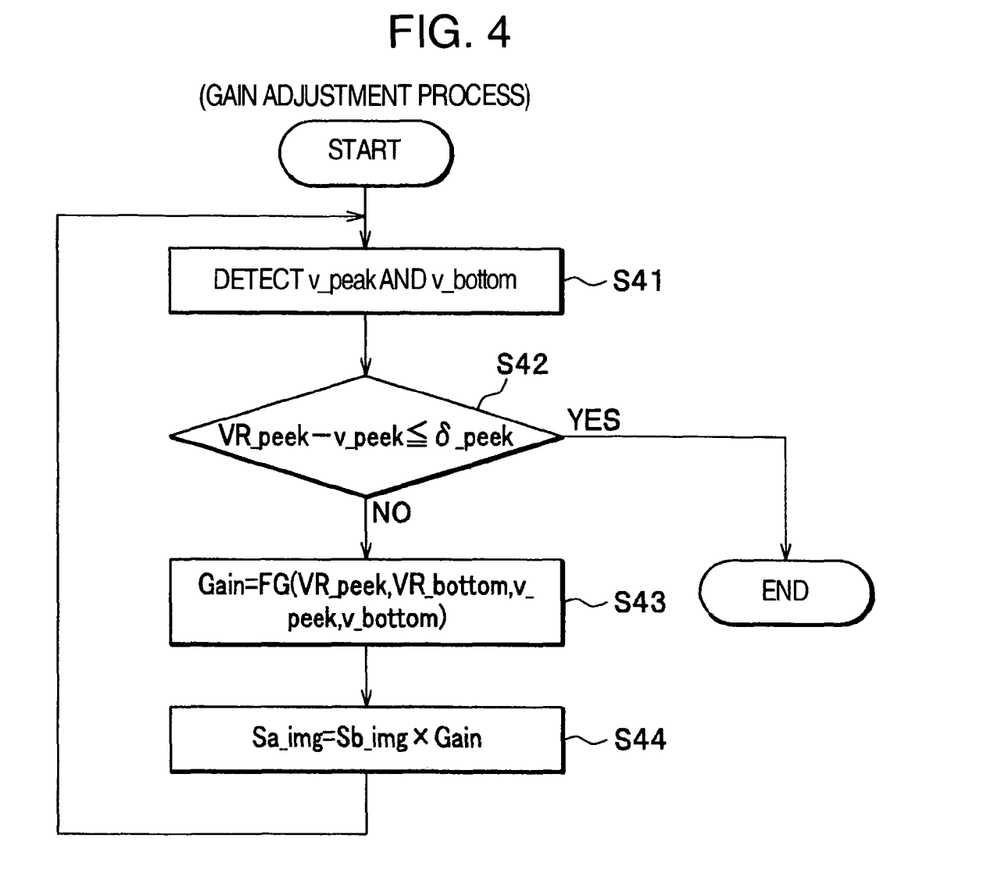
FIG. 4 is a flowchart of a gain adjustment process by the dynamic range adjustment unit in the SEM according to the embodiment of the invention.

Next, operation of the dynamic range adjustment unit 22 will be described with reference to FIGS. 3 and 4. Illustrated in FIG. 3 is a flowchart of an offset adjustment process by the dynamic range adjustment unit and in FIG. 4 is a flowchart of a gain adjustment process by the dynamic range adjustment unit. The dynamic range adjustment unit 22 first executes the offset adjustment process and sequentially the gain adjustment process.

In FIG. 3, in connection with the dynamic range adjustment unit 22, the dynamic range detection unit 23 first detects a v_bottom of an observation image signal after adjustment Sa_img the dynamic range adjustment unit 22 outputs by itself (step S31). But, as far as the first execution of the step S31 is concerned, a v_bottom of an observation image signal delivered out of the secondary electron detector 16 is detected. Here the v_bottom is a value corresponding to the minimum brightness V_bottom of the video signal but to discriminatively indicate the output signal of the dynamic range detector 23, distinction is made by indicating the initial letter in either small letter or capital letter. This relation holds between v_peak and V_peak to be described later.

Next, it is decided whether the difference between one of dynamic range reference values set in advance in the dynamic range reference value setting unit 21, which is VR_bottom, and the v_bottom detected in the step S31 is a value extremely approximating 0, which is less than δ_bottom (step S32). Here, δ_bottom is a preset value unique to the SEM 10.

If, in the decision in the step S32, the difference between VR_bottom and v_bottom is not less than δ_bottom (No in the step S32), an Offset value is calculated in accordance with equation (1) (step S33).

$$Offset = FO(VR\_bottom, v\_bottom) \quad (1)$$

where function FO is a function for converging the value of an expression (VR_bottom−v_bottom) to less than δ_bottom by controlling the Offset value.

Next, on the basis of the Offset value determined in the manner as above and an observation image signal before adjustment Sb_img, the observation image signal after adjustment Sa_img is calculated in accordance with equation (2) (step S34).

$$Sa\_img = Sb\_img + Offset \quad (2)$$

where when the step S34 is executed for the first time, an observation image signal outputted from the secondary electron detector 16 is used as the observation image signal before adjustment Sb_img but when the step S 34 is executed two or more times, an Sa_img calculated pursuant to equation (2) in the step S34 is used as the observation image signal before adjustment Sb_img.

After execution of the step S34, the program returns to the step S31 and the procedures in the S31 and ensuing steps are executed. Further, when the difference between VR_bottom and v_bottom is determined as being less than δ_bottom (Yes in the step S32), the execution of offset adjustment process ends.

Subsequently, the dynamic range adjustment unit 22 executes the gain adjustment process in accordance with FIG. 4. The dynamic range adjustment unit 22 responds to the dynamic range detection circuit 23 to detect v_peak and v_bottom of an observation image signal after adjustment Sa_img (step S41). But, as far as the step S41 is executed for the first time, an Sa_img calculated finally pursuant to equation (2) in the step S34 of offset adjustment process is used.

Next, it is decided whether the difference between the other of the dynamic reference values set in advance in the dynamic range reference value setting unit 21, which is VR_peak, and the v_peak detected in the step S31 is a value extremely approximating 0, which is less than δ_peak (step S42). Here, δ_peak is a value unique to the SEM 10 and set in advance.

If the decision in the step S42 does not determine that the difference between VR_peak and v_peak is less than δ_peak (No in the step S42), a Gain value is calculated pursuant to equation (3) (step S43).

$$Gain = FG(VR\_peak, VR\_bottom, v\_peak, v\_bottom) \quad (3)$$

where function FG is a function for converging the value of an expression (VR_peak−v_peak) to less than δ_peak by controlling the Gain value.

Next, on the basis of the Gain value and observation image signal before adjustment Sb_img determined as above, an observation image signal after adjustment Sa_img is calculated pursuant to equation (4) (step S44).

$$Sa\_img = Sb\_img \times Gain \quad (4)$$

where when the step S44 is executed for the first time, the Sa_img calculated finally pursuant to equation (2) in the step S34 of offset adjustment process is used as the observation image signal before adjustment Sb_img but when the step S44 is executed two or more times, the Sa_img calculated pursuant to equation (4) in the step S44 executed previously is used as an observation image signal before adjustment Sb_img.

After execution of the step S44, the program returns to the step S41 and the procedures in the S41 and ensuing steps are again executed. In case the decision in the step S42 determines that the difference between VR_peak and v_peak is less than δ_peak (Yes in the step S42), execution of the gain adjustment process ends.

In the SEM 10 constructed as above, the maximum brightness V_peak and minimum brightness V_bottom related to the dynamic range of observation image signal after adjustment Sa_img can be caused to extremely approximate the dynamic range reference values VR_peak and VR_bottom set in the dynamic range reference value setting unit 21, respectively. This signifies that by changing the dynamic range reference values VR_peak and VR_bottom suitably, the dynamic range of observation image signal after adjustment Sa_img can be controlled.

As the dynamic range of observation image signal after adjustment Sa_img changes, luminous intensity peak values P1 and P2 in the histogram displayed on the display unit 27 also change correspondingly. Namely, with the dynamic range reference values VR_peak and VR_bottom, the luminous intensity peak values P1 and P2 can be controlled.

These luminous intensity peak values P1 and P2 are numerical values objectively expressing the dynamic range of luminous intensity of display image as described previously and therefore, when the luminous intensity peak values P1 and P2 differ for a plurality of SEM's 10, reference luminous intensity peak values P10 and P20, for example, used as criterion are defined. Then, by controlling the dynamic range reference values VR_peak and VR_bottom in each SEM 10, the luminous intensity peak values P1 and P2 in each SEM 10 may be made to match the reference luminous intensity peak values P10 and P20. By doing so, the dynamic range of luminous intensity of display image can be made to be identical for a plurality of SEM's 10.

Reverting again to FIG. 1, how each of the reference luminous peak value setting unit 28 and alarm output unit 29 functions will be described.

As described previously, when the dynamic ranges of display images are made to be uniform for a plurality of SEM's, with a view to making uniform the luminous intensity peak values P1 and P2 obtained from the histogram, the reference luminous intensity peak values P10 and P20 to which the values P1 and P2 are referenced must be defined. The reference luminous intensity peak value setting unit 28 sets the reference luminous intensity peak values P10 and P20 by inputting predetermined setting values from, for example, a keyboard. In case a plurality of SEM's 10 are connected to a LAN (Local Area Network), the reference luminous intensity peak value setting unit 28 may set the reference luminous intensity peak values P10 and P20 by receiving predetermined setting values transmitted from, for example, an SEM management server (not shown) via the LAN.

The alarm output unit 29 compares luminous intensity peak values P1 and P2 for a specimen 19 which are extracted by the histogram generation unit 26 with reference luminous intensity peak values P10 and P20 set by the reference luminous intensity peak value setting unit 28. If the difference exists, indicating that the dynamic range of luminous intensity of the SEM 10 differs from the reference one, an alarm purporting that the dynamic range differs from the reference one is outputted to, for example, the display unit 27.

Figure 5:
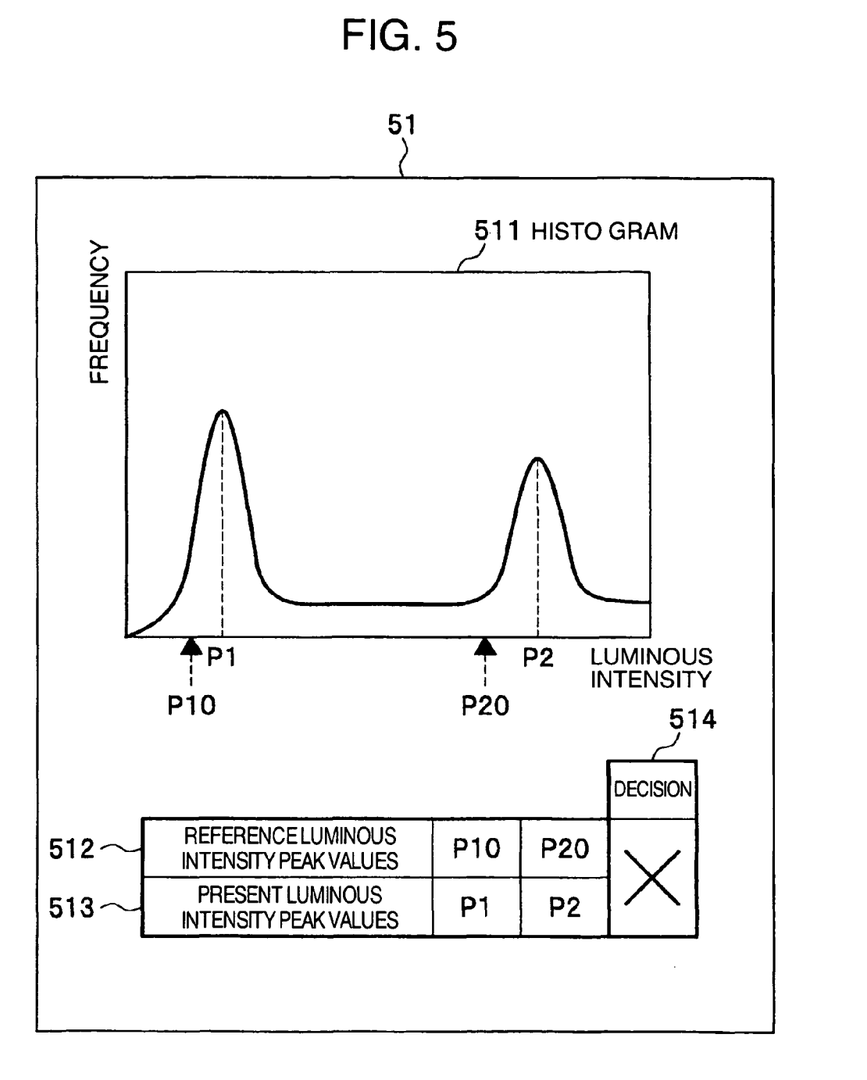
FIG. 5 is a diagram showing an example of a display screen displaying an alarm purporting "the dynamic range of luminous intensity of a display image differs from the reference one" issued by an alarm output unit in the SEM according to the embodiment of the invention.

Turning now to FIG. 5, there is illustrated an example of the display screen on which an alarm to the effect that the dynamic range of luminous intensity of display image differs from the reference one. As shown in FIG. 5, on a display screen 51 of the display unit 27, a histogram 511 of luminous intensity of a display image of the specimen 19, luminous intensity peak values P1 and P2 at present obtained from the histogram 511 (513) and reference luminous intensity peak values P10 and P20 set by the reference luminous intensity peak value setting unit 28 (512) are displayed together with a decision column 514. At that time, on abscissa (axis of luminous intensity direction) of the histogram 511, positions of reference luminous intensity peak values P10 and P20 may also be indicated in addition to the luminous intensity peak values P1 and P2 at present.

The decision column 514 is an exemplified form of alarm display to the effect that the dynamic range differs from the reference one and in the FIG. 5 example, when the luminous intensity peak values P1 and P2 at present in the SEM 10 of interest (513) differs from the reference luminous intensity peak values P10 and P20 (512), an X mark, for example, is displayed in the decision column 514. If the former two values coincide with the latter two values, a ◯ mark, for example, is displayed in the decision column 514.

In addition to displaying ◯ or X mark in the decision column 514, an alarm indicating that the dynamic range differs from the reference one can be given in various ways. For example, putting ◯ or X mark aside, a message purporting that the dynamic range differs from the reference one may be used. Alternatively, the message may be voiced so as to be outputted from a loudspeaker, for instance.

Through the means as above, the operator can be facilitated to decide whether in the SEM 10 of interest the dynamic range is identical to the reference one or not and in the presence of the difference, the operator can adjust the dynamic range of luminous intensity of a display image in the SEM 10 by resetting the dynamic range reference values VR_peak and VR_bottom.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A scanning electron microscope comprising:
a secondary electron detector for detecting secondary electrons discharged from the surface of a specimen when a primary electron beam is irradiated on the specimen surface, generating an observation image signal on the basis of an amount of detected secondary electrons and outputting the observation image signal; and
an image signal processor for generating a display image of said specimen surface on the basis of the observation image signal delivered out of said secondary electron detector and displaying the display image, wherein said image signal processor includes:
dynamic range reference value setting means for setting dynamic range reference values;
storage means for storing the observation image signal from the secondary electron detector with respect to a reference luminous intensity peak generation specimen which is configured to provide peaks at positions corresponding to a minimum luminous intensity and a maximum luminous intensity on a histogram expressing frequency luminous intensity, the reference luminous intensity peak generation specimen having alternately arranged black and white stripes;
dynamic range adjustment means for adjusting a dynamic range of said observation image signal on the basis of said dynamic range reference values set by the dynamic range reference value setting means, and outputting the thus adjusted observation image signal as an observation image signal after adjustment;
display image generation means for determining luminous intensity levels of individual pixels of an image to be displayed on the basis of the observation image signal after adjustment outputted from said dynamic range adjustment means to generate a display image;
histogram generation means for generating a histogram of luminous intensity levels of the individual pixels of said generated display image and extracting from the thus generated histogram a value at which the frequency corresponding to a luminous intensity level is maximized as a luminous intensity peak value; and
histogram display means for displaying said extracted luminous intensity peak which becomes a reference of a luminous peak and a histogram to be generated.

2. A scanning electron microscope according to claim 1, wherein said image signal processor further includes:
alarm output means for outputting, when the luminous intensity peak value extracted by said histogram generation means differs from the reference luminous intensity peak value set by said reference luminous intensity peak value setting means, an alarm purporting that said luminous intensity peak value differs from said reference luminous intensity peak value.

3. A scanning electron microscope according to claim 2, wherein
said reference luminous intensity peak value setting means sets, as reference luminous intensity peak values, two intensity values of a first luminous intensity level near the minimum luminous intensity and a second luminous intensity level near the maximum luminous intensity.

4. An image signal processing method in a scanning electron microscope having a secondary electron detector for detecting secondary electrons discharged from the surface of a specimen when a primary electron beam is irradiated on the specimen surface, generating an observation image signal on the basis of an amount of detected secondary electrons and outputting the observation image signal and an image signal processor for generating a display image of said specimen surface on the basis of the observation image signal delivered out of said secondary electron detector, said image signal processor including a display image memory unit and a histogram display unit, said method comprising the steps of:
setting dynamic range reference values;
storing the observation image signal from the secondary electron detector with respect to a reference luminous intensity peak generation specimen which is configured to provide peaks at positions corresponding to a minimum luminous intensity and a maximum luminous intensity on a histogram expressing frequency luminous intensity, the reference luminous intensity peak generation specimen having alternately arranged black and white stripes;

adjusting the dynamic range of the observation image signal on the basis of said dynamic range reference values and outputting an adjusted observation image signal as an observation image signal after adjustment;

generating a display image by determining luminous intensity levels of individual pixels of an image to be displayed on the basis of the observation image signal after adjustment outputted in said dynamic range adjustment step and generating a display image;

generating a histogram of luminous intensity levels of the individual pixels of said generated display image and extracting from said generated histogram a luminous intensity peak value at which the frequency corresponding to a luminous intensity level is maximized as a luminous intensity peak value;

displaying the extracted luminous intensity peak which becomes a reference of a luminous peak and a histogram to be generated.

5. An image signal processing method according to claim 4, causing said image signal processor to further execute the step of:

when the luminous intensity peak value extracted in said histogram generation step differs from the reference luminous intensity peak value set in said reference luminous intensity peak value setting step, outputting an alarm purporting that said luminous intensity peak value and said reference luminous intensity peak value differ from each other.

6. An image signal processing method according to claim 5, wherein in said reference luminous intensity peak value setting step, two luminous intensity values of a first luminous intensity level near the minimum luminous intensity and a second luminous intensity level near the maximum luminous intensity are set as reference luminous intensity peak values.

7. A scanning electron microscope comprising: an electron source, a lens for focusing an electron beam emitted from the electron source, a scanning deflector for scanning the electron beam on a specimen, a detector for detecting electron caused by irradiation of an electron beam to the specimen, and an image signal processing apparatus for generating an image of a specimen surface in accordance with an output of the detector, wherein the image signal processing apparatus includes:

a dynamic range reference value setting unit for setting a dynamic range reference value;

a storage means for storing the output from the detector with respect to a reference luminous intensity peak generation specimen which is configured to provide peaks at positions corresponding to a minimum luminous intensity and a maximum luminous intensity on a histogram expressing frequency luminous intensity, the reference luminous intensity peak generation specimen having alternately black and white stripes;

a dynamic range adjustment unit for adjusting a dynamic range based on the dynamic range reference value;

a histogram generation unit for generating a histogram in accordance with the output of the detector; and histogram display means for displaying said generated histogram which becomes a reference of a luminous peak and a histogram to be generated.

8. A scanning electron microscope according to claim 7, wherein the dynamic range adjustment unit converges a difference between a minimum luminous of the histogram generated in accordance with the output of the detector and the lowest luminous set by the dynamic range reference value setting unit to be not more than a predetermined value.

9. A scanning electron microscope according to claim 7, wherein the dynamic range adjustment unit converges a difference between a maximum luminous of the histogram generated in accordance with the output of the detector and the maximum luminous set by the dynamic range reference value setting unit to be not more than a predetermined value.

10. A scanning electron microscope according to claim 7, wherein the dynamic range adjustment unit converges a difference between a minimum luminous of the histogram generated in accordance with the output of the detector and the lowest luminous set by the dynamic range reference value setting unit to be not more than a predetermined value, and after the convergence, further converges a difference between a maximum luminous of the histogram and the maximum luminous set by the dynamic range reference value setting unit to be not more than a predetermined value.

11. A scanning electron microscope according to claim 7, wherein the dynamic range adjustment unit carries out an offset adjustment such that a difference between a minimum luminous of the histogram generated in accordance with the output of the detector and the lowest luminous set by the dynamic range reference value setting unit is to be converged, and carries out a gain adjustment such that a difference between a maximum luminous of the histogram and the maximum luminous set by the dynamic range reference value setting unit is to be converged.

12. A scanning electron microscope according to claim 7, wherein the histogram generation unit displays both histogram generated in accordance with output of the detector and information concerned with the maximum luminous and minimum luminous set by the dynamic range reference value setting unit on a display apparatus.

* * * * *